(12) United States Patent
Tsou et al.

(10) Patent No.: US 11,056,607 B2
(45) Date of Patent: Jul. 6, 2021

(54) COMPLEX SENSING DEVICE PACKAGING STRUCTURE AND PACKAGING METHOD

(71) Applicant: SensorTek technology Corp., Hsinchu County (TW)

(72) Inventors: Wen-Chieh Tsou, Hsinchu County (TW); Yi-Hua Chang, Hsinchu County (TW); Chih-Wei Chen, Hsinchu County (TW)

(73) Assignee: SensorTek technology Corp., Hsinchu County (TW)

( * ) Notice: Subject to any disclaimer, the term of this patent is extended or adjusted under 35 U.S.C. 154(b) by 0 days.

(21) Appl. No.: 16/512,406

(22) Filed: Jul. 16, 2019

(65) Prior Publication Data
US 2020/0044112 A1  Feb. 6, 2020

Related U.S. Application Data

(60) Provisional application No. 62/698,292, filed on Jul. 16, 2018.

(51) Int. Cl.
*H01L 31/112* (2006.01)
*G01S 17/08* (2006.01)
*H01L 31/0203* (2014.01)
*H01L 33/54* (2010.01)

(52) U.S. Cl.
CPC ............ *H01L 31/112* (2013.01); *G01S 17/08* (2013.01); *H01L 31/0203* (2013.01); *H01L 33/54* (2013.01)

(58) Field of Classification Search
CPC . G01S 7/4813; H01L 25/167; H01L 31/0203; H01L 31/12; H01L 31/16; H01L 31/18; H01L 33/54
See application file for complete search history.

(56) References Cited

U.S. PATENT DOCUMENTS

| | | | |
|---|---|---|---|
| 2014/0021491 A1* | 1/2014 | Meng | H01L 33/005 257/82 |
| 2015/0070577 A1* | 3/2015 | Ikemoto | H04N 5/2253 348/374 |
| 2016/0245996 A1* | 8/2016 | Nomura | H01L 25/167 |
| 2018/0190856 A1* | 7/2018 | Lin | H01L 25/167 |

FOREIGN PATENT DOCUMENTS

| | | |
|---|---|---|
| CN | 103579015 A | 2/2014 |
| CN | 204425476 U | 6/2015 |
| TW | 201428982 A | 7/2014 |
| TW | 201435379 A | 9/2014 |
| TW | 201512693 A | 4/2015 |

* cited by examiner

*Primary Examiner* — Allan R Wilson
(74) *Attorney, Agent, or Firm* — Winston Hsu

(57) ABSTRACT

A complex sensing device packaging structure includes a light emitting element sealed in a first transparent molding material, a light sensing element sealed in a second transparent molding material, a substrate disposed with the light emission element, the light sensing element, the first transparent molding material and the second transparent molding material, and an opaque blocking element disposed on the substrate and between the first transparent molding material and the second transparent molding material, wherein the opaque blocking element is formed by performing a solidifying process to an opaque glue being liquid at the room temperature.

11 Claims, 10 Drawing Sheets

COMPLEX SENSING DEVICE PACKAGING STRUCTURE AND PACKAGING METHOD

CROSS REFERENCE TO RELATED APPLICATION

This application claims the benefit of U.S. provisional application No. 62/698,292, filed on Jul. 16, 2018, the contents of which are incorporated herein.

BACKGROUND OF THE INVENTION

1. Field of the Invention

The present invention relates to a packaging structure and packaging method, and more particularly, to a complex sensing device packaging structure and packaging method.

2. Description of the Prior Art

Proximity sensors and ambient light sensors are widely used in portable communication devices such as mobile phones and consumer electronics. The proximity sensor and the ambient light sensor both require a light sensing element, and the proximity sensor further requires a light emitting element (e.g., an infrared transmitter). In order to avoid lights generated by the light emitting element from interfering with the light sensing element, a conventional method is to keep a distance between the light sensing element and the light emitting element to avoid crosstalk. However, such method not only takes a larger space in the electronic device but also consumes more energy (e.g., a signal transmitting a longer distance consumes more energy). A method to avoid crosstalk under a limited space is to dispose a blocking element between the light emitting element and the light sensing element, wherein the blocking element is generally formed during a chip packaging process.

A current packaging process is to use a metal cover or a plastic cover as the blocking element. However, the metal cover and the plastic cover are formed by a customized mold. Due to the limitation of mold manufacturing, difficulty in making the mold of the blocking element significantly increases when the blocking element miniaturizes as sizes of a circuit area and the sensors shrink. In addition, the miniaturized metal cover and miniaturized plastic cover are hard to be fixed and easily misplaced.

Another current packaging process is to use double injection molding technology to form an opaque molding material (e.g., resin) between the light emitting element and the light sensing element to be the blocking element. FIG. 1 illustrates a packaging structure 1 of a proximity sensor and an ambient light sensor according to the prior art. A light emitting element 11 and a light sensing element 13 are disposed on a substrate 10. During a first injection molding step, a liquid transparent resin is injected into a mold to form transparent molding materials 16 and 17 after solidification. There is a molding space formed between the transparent molding materials 16 and 17. During a second injection molding step, an opaque resin ingot is heated up to become liquid to be injected between the transparent molding materials 16 and 17 under pressure, so as to fill the molding space to form an opaque molding material 18. However, since the opaque resin ingot has to be heated to a high temperature (e.g., 140 Celsius degrees) to become liquid, which leads the transparent molding materials 16 and 17 to be softened because the high temperature is higher than a glass transition temperature (also known as Tg point, e.g., 120. Celsius degrees) of the transparent molding materials 16 and 17. In such a situation, the transparent molding materials 16 and 17 become misshaped when the liquid opaque resin is injected into the molding space under pressure. In addition, the softened transparent molding materials 16 and 17 are too weak to provide enough support for the opaque molding material 18, and thus it is difficult for the transparent molding material 18 and the transparent molding materials 16 and 17 to be combined together to form a predetermined structure. It was found in practice that the opaque molding material 18 and the transparent molding materials 16 and 17 are deformed after heat up and down for solidification, and there are seams between side surfaces 18R and 18L of the opaque molding material 18 and the side surfaces of the transparent molding materials 16 and 17.

Based on the abovementioned disadvantages, it is necessary to provide a packaging structure and process for the proximity sensor and the ambient light sensor to avoid crosstalk, miniaturize size, and meet the practical requirements.

SUMMARY OF THE INVENTION

It is therefore an objective of the present invention to provide a complex sensing device packaging structure and packaging method capable of forming an opaque blocking element by solidifying an opaque glue being liquid at the room temperature.

The present invention discloses a complex sensing device packaging structure including a light emitting element sealed in a first transparent molding material; a light sensing element sealed in a second transparent molding material; a substrate disposed with the light emitting element, the light sensing element, the first transparent molding material and the second transparent molding material; and an opaque blocking element disposed on the substrate and between the first transparent molding material and the second transparent molding material, wherein the opaque blocking element is formed by performing a solidifying process to an opaque glue being liquid at the room temperature.

The present invention further discloses a complex sensing device packaging method including disposing a light emitting element and a light sensing element on a substrate; sealing the light emitting element in a first transparent molding material, and sealing the light sensing element in a second transparent molding material; forming a molding space between the first transparent molding material and the second transparent molding material; and dropping a liquid opaque glue into the molding space to form a blocking element by performing a solidifying process to the liquid opaque glue.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
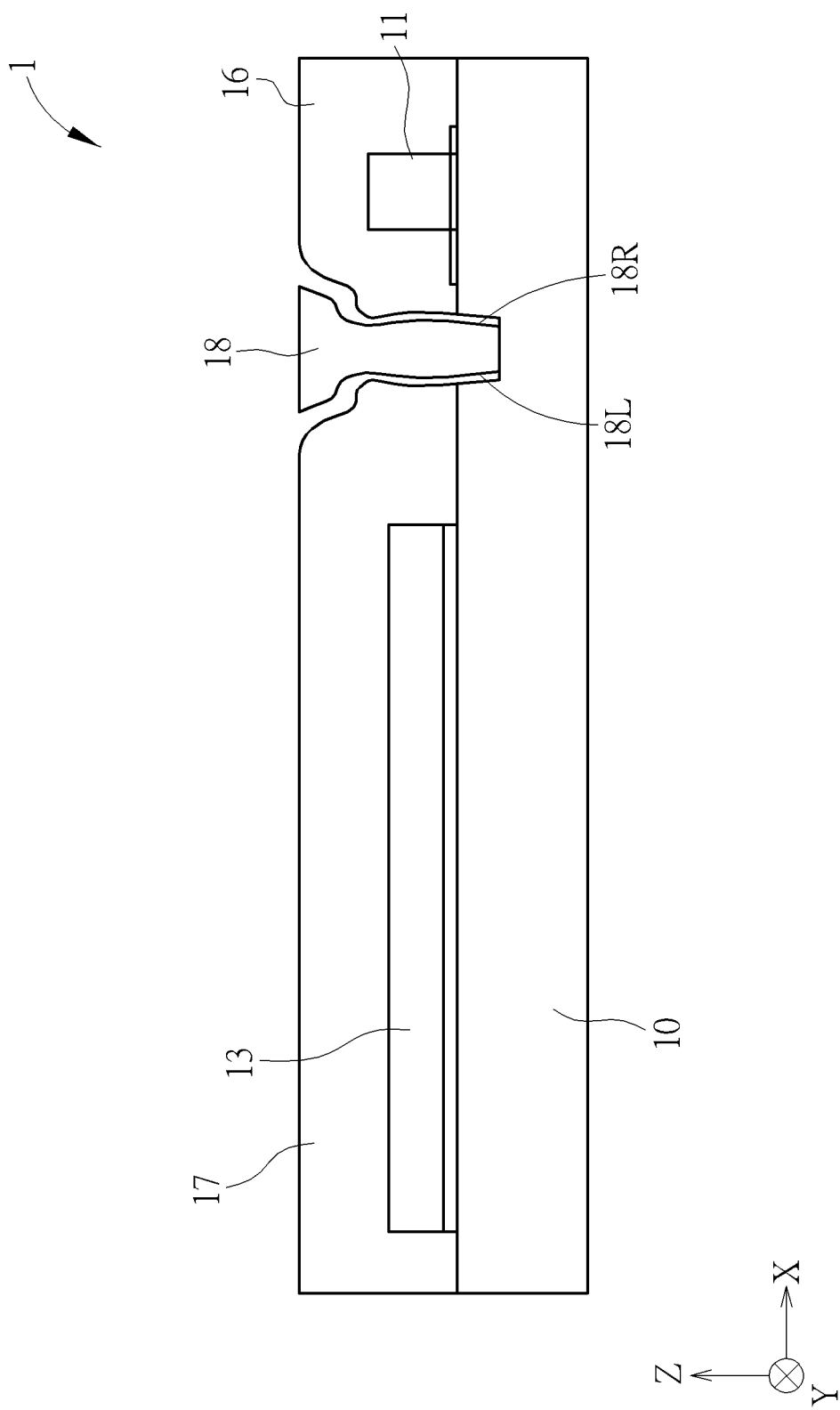
FIG. 1 illustrates a packaging structure of a proximity sensor and an ambient light sensor.

FIG. 2A to FIG. 2D illustrate a packaging process of a complex sensing device packaging structure 2 according to an embodiment of the present invention. The complex sensing device packaging structure 2 includes a substrate 20, a light emitting element 21, wires 22 and 24, and a light sensing element 23.

Figure 2A:
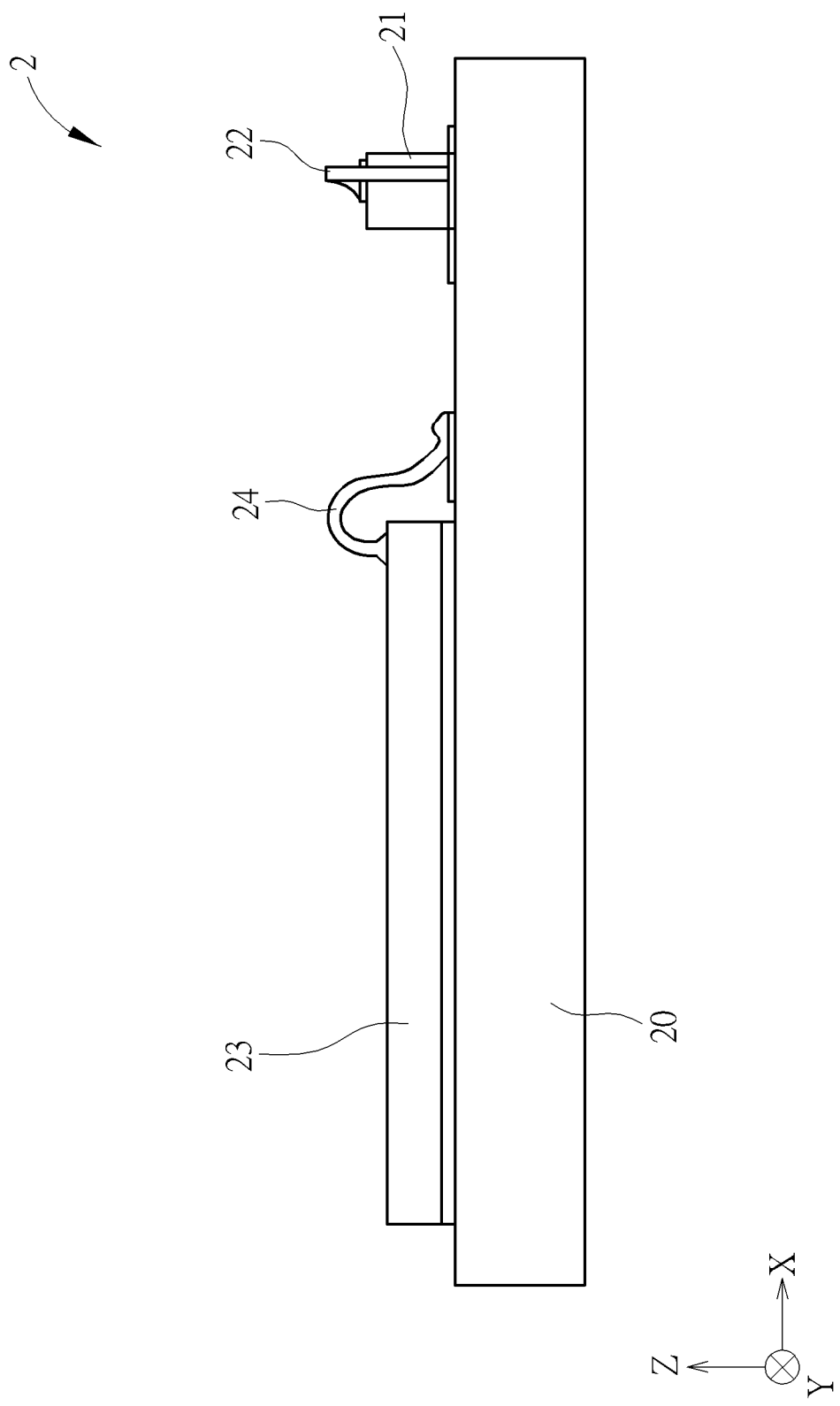
FIG. 2A to FIG. 2D illustrate a packaging process of a complex sensing device packaging structure according to an embodiment of the present invention.

As shown in FIG. 2A, the light emitting element 21 and the light sensing element 23 are disposed on the substrate 20, wherein light emitting element 21 is connected to the substrate 20 by the wire 22, and the light sensing element 23 is connected to the substrate 20 by the wire 24. However, in addition to a wiring process, the light emitting element 21 and the light sensing element 23 can be connected to the substrate 20 by any possible methods, which is not limited in the present invention. In an embodiment, the substrate 20 is a copper substrate, a ceramic substrate, a lead frame, a resin substrate or a printed circuit board, and the wires 22 and 24 can be gold wires, which is not limited.

In this embodiment, the complex sensing device packaging structure 2 can be integrated with a proximity sensor and an ambient light sensor (ALS). The light emitting element 21 is configured to generate a transmission light (e.g., an infrared light). The light sensing element 23 is configured to receive a reflected light of the transmission light, which allows the proximity sensor to calculate distance according to the transmission light and the reflected light. In addition, the light sensing element 23 is also configured to receive an ambient light generated by ambient light sources, which allows the ambient light sensor to calculate light intensity. In an embodiment, computation circuits for the proximity sensor and the ambient light sensor and the light sensing element 23 are disposed in a same area, while the light emitting element 21 is disposed distant from the area. In another embodiment, the proximity sensor and the ambient light sensor use independent light sensing elements, respectively.

Under a limited space, in order to reduce a crosstalk between the light sensing element 23 and the light emitting element 21, the present invention forms an opaque blocking element between the light sensing element 23 and the light emitting element 21 to avoid light sensing element 23 from directly receiving the transmission light generated by the light emitting element 21.

Figure 2B:
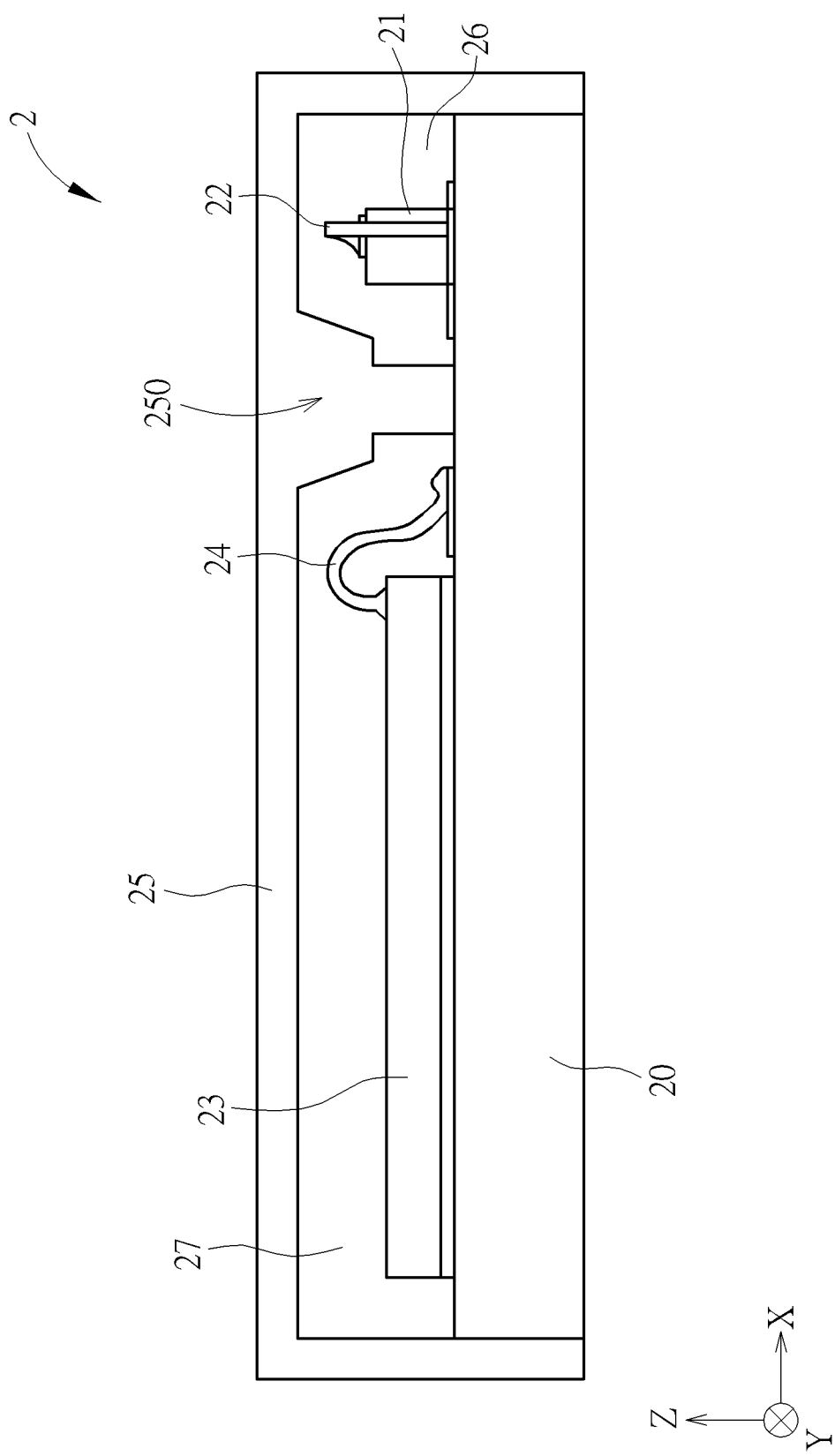

Specifically, as shown in FIG. 2B, during an injection molding process, the complex sensing device packaging structure 2 is covered by a mold 25, then a liquid transparent glue (e.g., a resin) is injected into the mold 25 to form transparent molding materials 26 and 27 after solidification, and the mold 25 is removed. The light emitting element 21 and the wire 22 are sealed in the transparent molding material 26, and the light sensing element 23 and the wire 24 are sealed in the transparent molding material 27. A molding space 250 is formed between the transparent molding materials 26 and 27 to separate the transparent molding materials 26 and 27 from each other. In this embodiment, the molding space 250 has a shape of funnel, which is not limited; the shape of the molding space 250 can be an I-shape, a T-shape or any possible shapes.

Figure 2C:
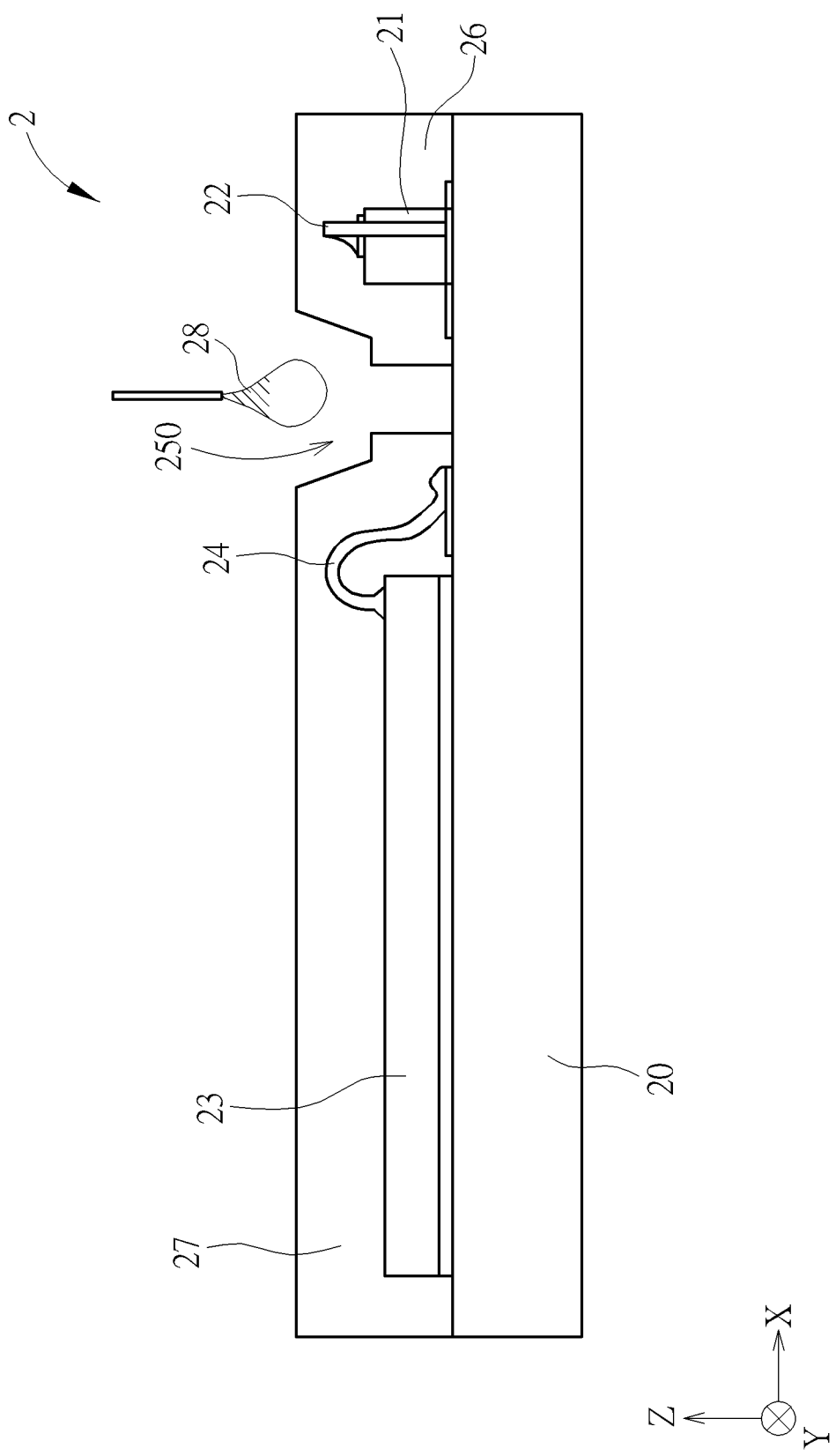

As shown in FIG. 2C, a liquid opaque glue 28 is dropped into (or tapped into or applied onto) the molding space 250. Note that the liquid opaque glue 28 in this embodiment is liquid under the room temperature, so the opaque glue 28 is able to be dropped into the molding space 250 without heating up or pressure injection. As a result, the present invention solves the problem of softening the transparent molding materials 26 and 27 due to heating up to the glass transition temperature in FIG. 1 of the prior art, and also solves the problem of deformation to the transparent molding materials 26 and 27 due to pressure injection.

Figure 2D:
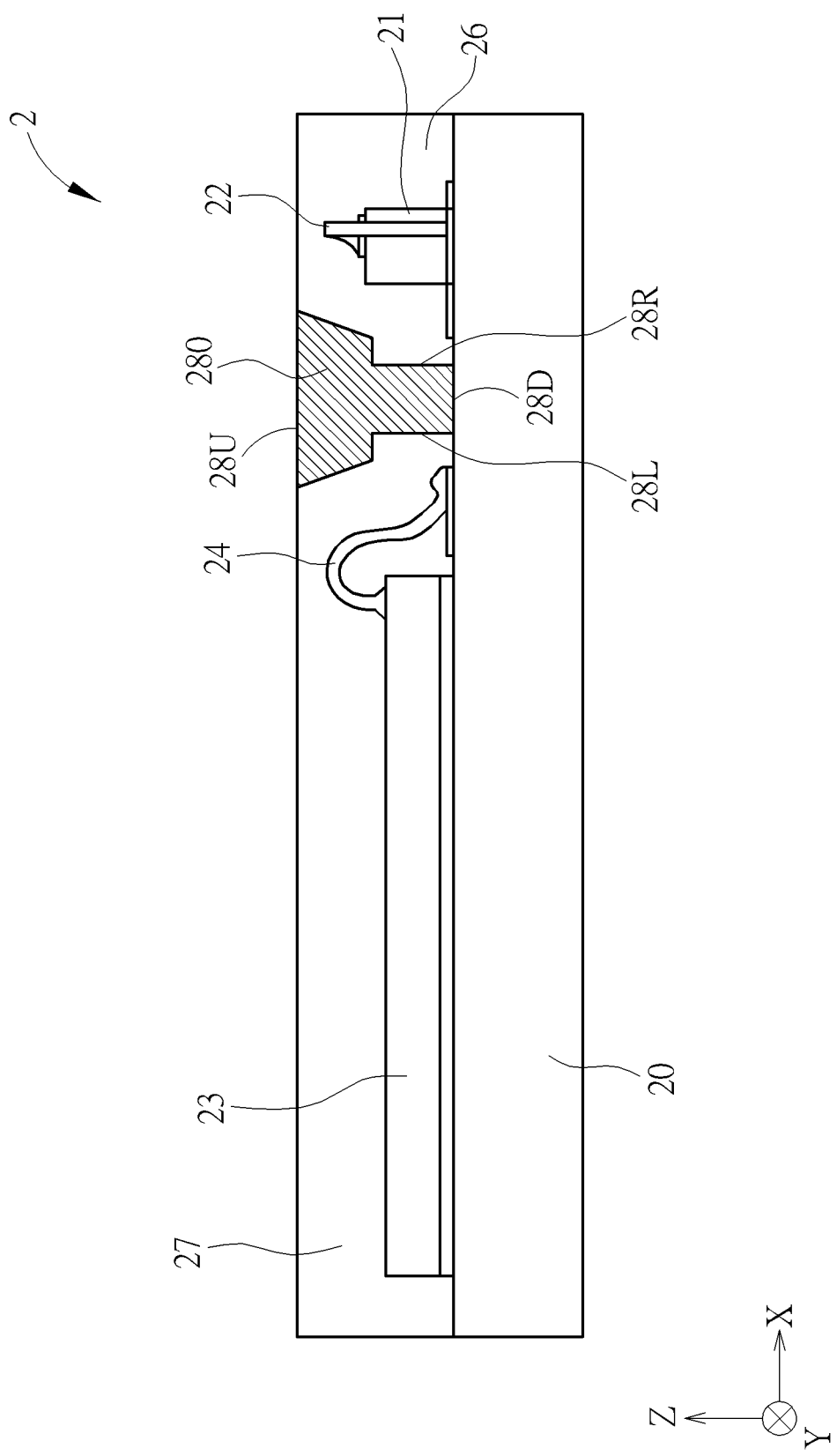

As shown in FIG. 2D, a solidification process is performed to the complex sensing device packaging structure 2 to solidify the liquid opaque glue 28, so as to form the blocking element 280. In such a structure, the transmission light generated by the light emitting element 21 may propagate through the transparent molding material 26, the ambient light and the reflected light may propagate through the transparent molding material 27 to be received by the light sensing element 23, and the blocking element 280 may avoid the transmission light generated by the light emitting element 21 from directly receiving by the light sensing element 23, which satisfies the need of transmission and reception and reduces crosstalk. The solidification process is a process to convert the liquid opaque glue 28 into a solid material, for example, the solidification process can be baking, i.e., heating the complex sensing device packaging structure 2 up to 100 Celsius degrees. However, based on the material of the liquid opaque glue 28, the solidification process can be a low temperature solidification process lower than 100 Celsius degrees, a room temperature solidification process (in which the liquid opaque glue 28 is contacted with gas or liquid to solidify), a high temperature solidification process higher than 100 Celsius degrees and lower than a glass transition temperature of the transparent molding materials 26 and 27, an ultraviolet solidification process, and the like.

Note that the opaque glue 28 in this embodiment can be made of epoxy resin, silicone glue, resin and silicone complex glue, or acrylic adhesive, and the opaque glue 28 can be made of opaque materials such as black epoxy resin, or the opaque glue 28 can be colored by doping dye, black carbon, cerium oxide or titanium dioxide. A solidification temperature of the opaque glue 28 is lower than a glass transition temperature of the transparent molding materials 26 and 27, so the transparent molding materials 26 and 27 are not going to become softened during the baking process, and are able to provide enough support to make the blocking element 280 and the transparent molding materials 26 and 27 to combine to a predetermined structure. For example, a right surface 28R of the blocking element 280 is contacted with the transparent molding material 26, a left surface 28L of the blocking element 280 is contacted with the transparent molding material 27, and a lower surface 28D of the blocking element 280 is contacted with the substrate 20. In addition, by controlling an amount of the liquid opaque glue 28 dropping into the molding space 250, an upper surface 28U of the blocking element 280 can be a flat surface or a convex surface to control light emission angle and range of the transmission light to meet requirements for different applications.

In brief, the present invention chooses the opaque glue with proper characteristics (e.g., the opaque glue made of epoxy resin, silicone glue, resin and silicone complex glue, or acrylic adhesive, the opaque glue is liquid at the room temperature and the solidification temperature of the opaque glue is lower than the glass transition temperature of the transparent molding material), by forming the opaque blocking element 280 between the light sensing element 23 and the light emitting element 21 in the present invention embodiment, the blocking element 280 and the transparent molding materials 26 and 27 can combined firmly to avoid generating the seams from between the opaque molding material 18 and the transparent molding materials 16 and 17 during heating up and down for solidification in the prior art.

FIG. 3A to FIG. 3D illustrate a packaging process of a complex sensing device packaging structure 3 according to an embodiment of the present invention. The complex sensing device packaging structure 3 includes a substrate 30, a light emitting element 31, wires 32 and 34, and a light sensing element 32.

Figure 3A:
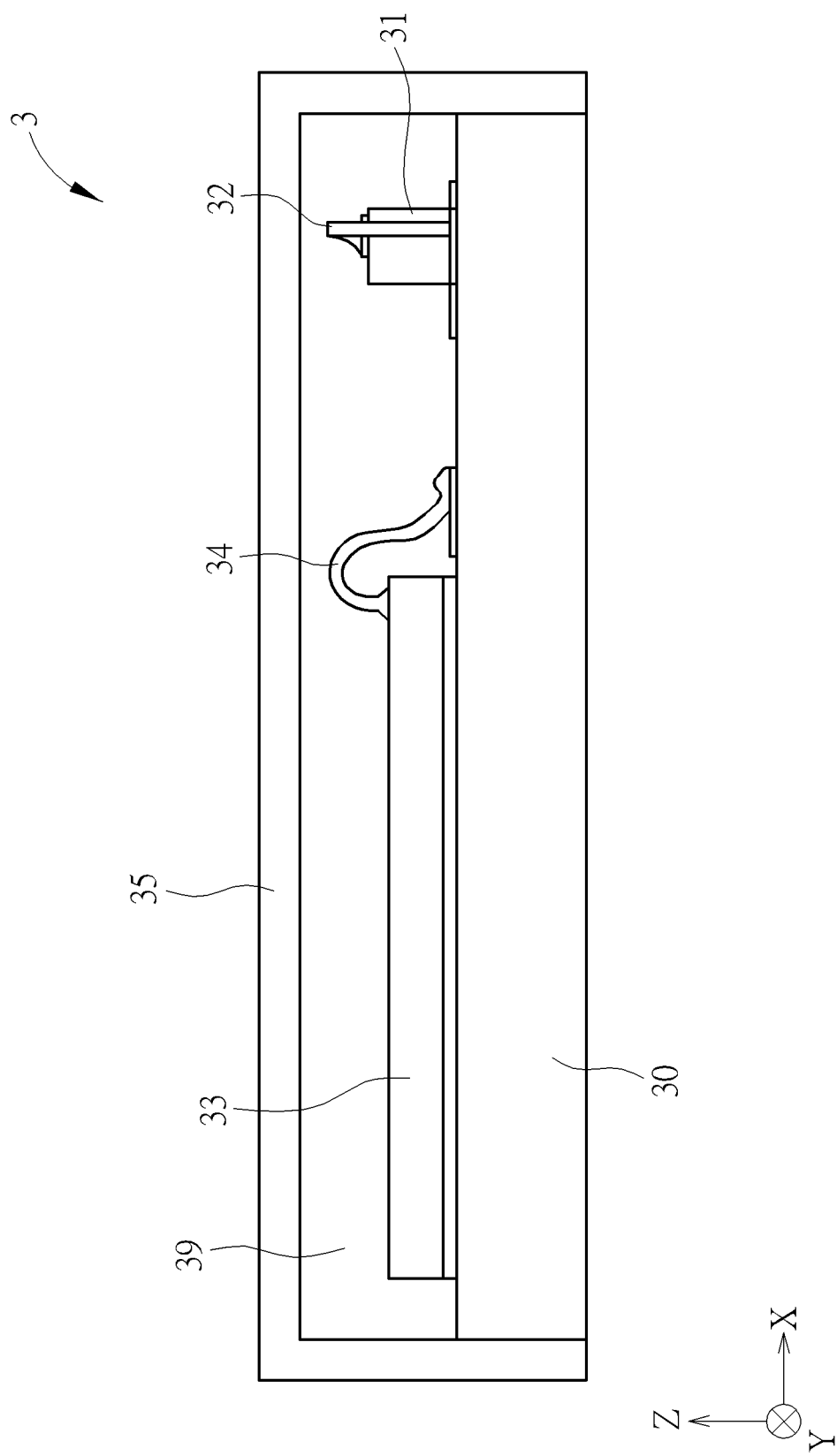
FIG. 3A to FIG. 3D illustrate a packaging process of a complex sensing device packaging structure according to an embodiment of the present invention.

As shown in FIG. 3A, the light emitting element 31 and the light sensing element 32 are disposed on the substrate 30, wherein the light emitting element 31 is connected to the substrate 30 by the wire 32, and the light sensing element 32 is connected to the substrate 30 by the wire 34. During an injection molding process, the complex sensing device packaging structure 3 is covered by a mold 35, then a liquid transparent glue (e.g., resin) is injected into the mold 35, a transparent molding material 39 is formed after solidification, and the mold 35 is removed. The light emitting element 31, the light sensing element 33 and the wires 32 and 34 are sealed in the transparent molding material 39.

Figure 3B:
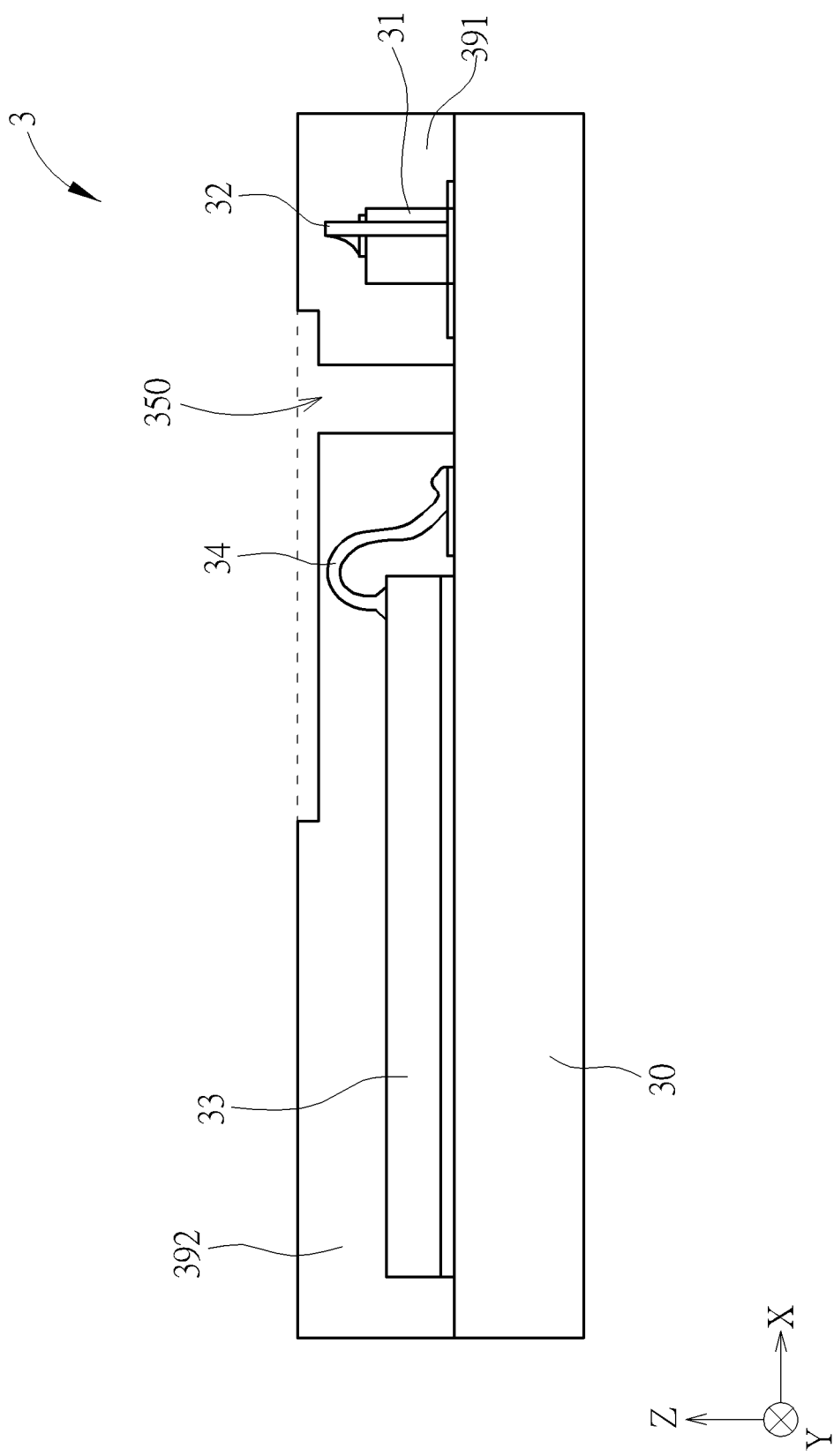

As shown in FIG. 3B, a cutting knife or a grinding machine is used to carve the transparent molding material 39 to form a molding space 350 and transparent molding materials 391 and 392, wherein the light emitting element 31 and the wire 32 are sealed in the transparent molding material 391, the light sensing element 23 and the wire 24 are sealed in the transparent molding material 392. The molding space 350 is formed between the transparent molding materials 391 and 392 to separate the transparent molding materials 391 and 392 from each other. In this embodiment, since a computation circuit for the proximity sensor and the ambient light sensor and the light sensing element 32 are disposed in a same area, when considering a layout design, the light sensing element 32 can be disposed away from the light emitting element 31, and the computation circuit for the proximity sensor and the ambient light sensor can be disposed close to the light emitting element 31. Without affecting a light sensing capability of the light sensing element 32, the molding space 350 may extend to an upper area of the light sensing element 32, so a shape of the molding space 350 can be an asymmetric T-shape, which is not limited; the shape of the molding space 350 can be an I-shape, a funnel shape or any possible shapes.

Figure 3C:
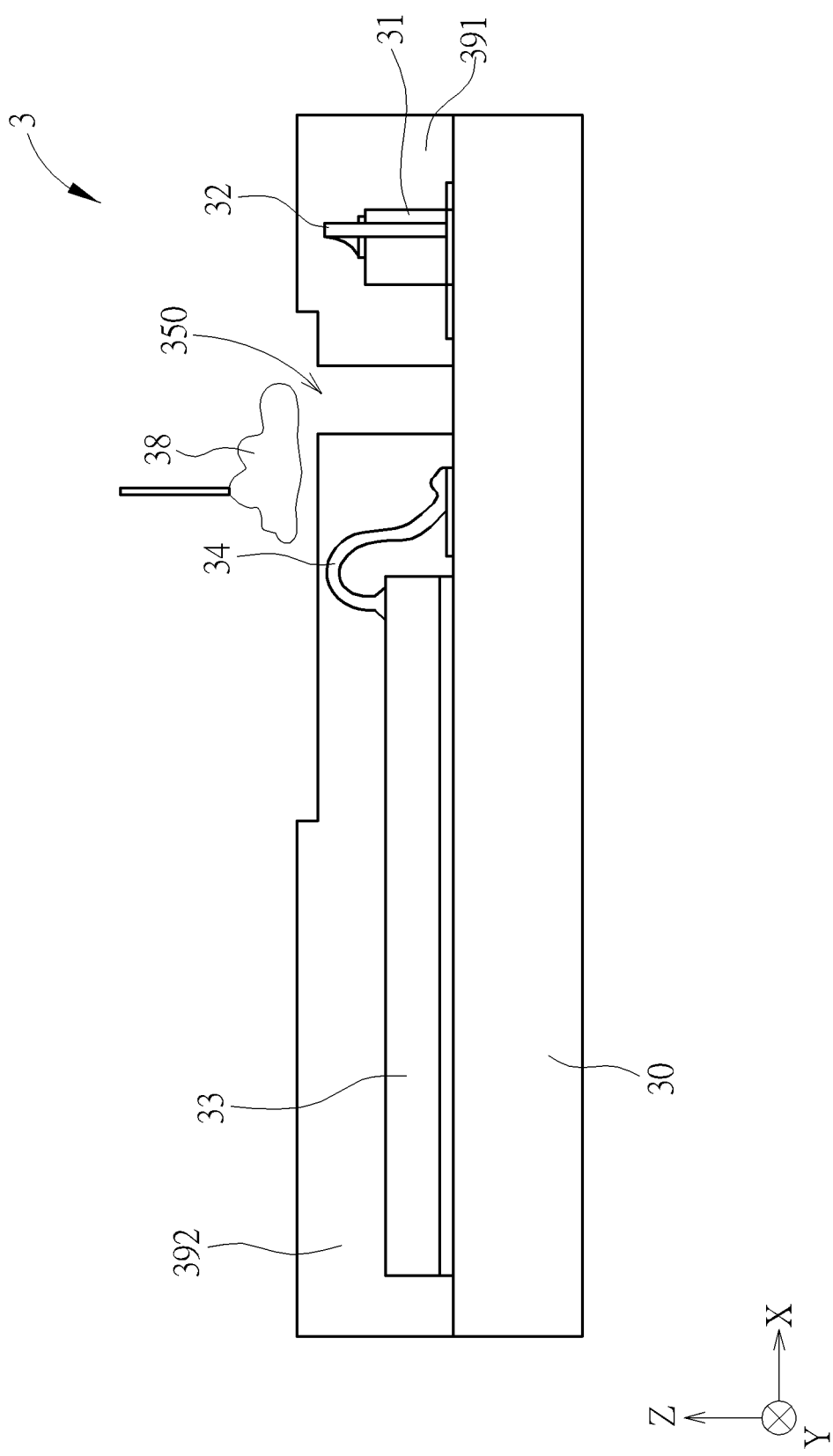
Figure 3D:
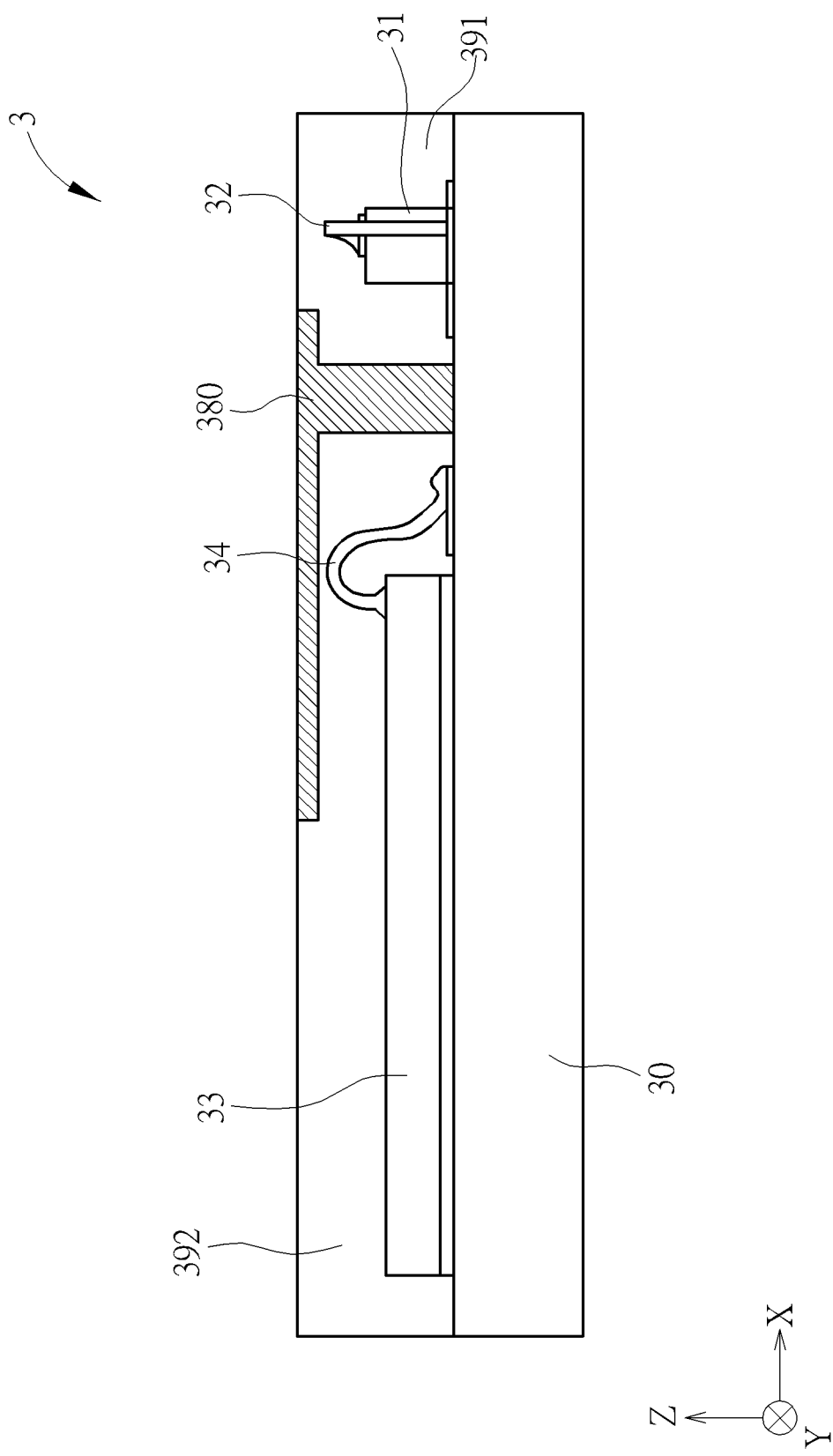

As shown in FIG. 3C, a liquid opaque glue 38 is dropped into (or tapped into or applied onto) the molding space 350. As shown in FIG. 3D, a solidification process (e.g., the baking process abovementioned) is performed to the complex sensing device packaging structure 3 to solidify the liquid opaque glue 38 to form the blocking element 380.

Note that a difference between the complex sensing device packaging structures 2 and 3 is shaping methods for the molding space of the blocking element. The molding space 250 of the complex sensing device packaging structure 2 is shaped by the mold 25, which has an advantage of less processing steps but a disadvantage of low flexibility (e.g., the mold 25 cannot be reused in another complex sensing device packaging structure with different specification). The molding space 350 of the complex sensing device packaging structure 3 is carved by a cutting knife or a grinding machine, which has an advantage of high flexibility (e.g., the cutting knife or the grinding machine is able to carve various and complex shapes) but a disadvantage of more processing steps. Those skilled in the art may choose proper shaping methods according to practical requirements.

Figure 4:
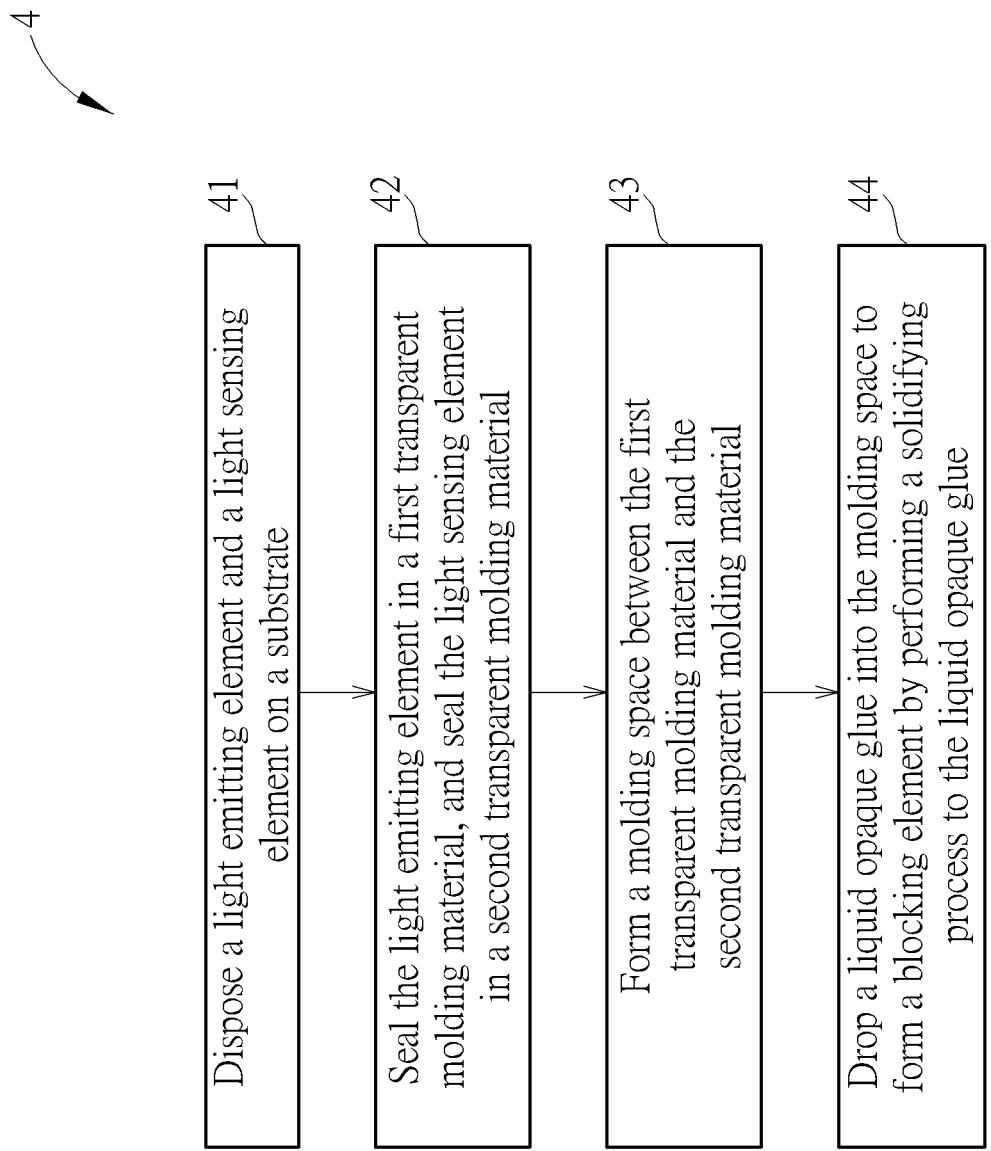
FIG. 4 is a flowchart of a packaging process according to an embodiment of the present invention.

A manufacturing method for the complex sensing device packaging structures 2 and 3 can be summarized into a packaging process 4, as shown in FIG. 4, the packaging process 4 includes the following steps.

Step 41: Dispose a light emitting element and a light sensing element on a substrate.

Step 42: Seal the light emitting element in a first transparent molding material, and seal the light sensing element in a second transparent molding material.

Step 43: Form a molding space between the first transparent molding material and the second transparent molding material.

Step 44: Drop a liquid opaque glue into the molding space to form a blocking element by performing a solidifying process to the liquid opaque glue.

Detailed operations regarding the packaging process 4 can be obtained by referring to descriptions regarding FIGS. 2A, 2B, 2C and 2D and FIGS. 3A, 3B, 3C and 3D, which is omitted.

To sum up, the present invention chooses the opaque glue with proper characteristics (e.g., the opaque glue made of epoxy resin, silicone glue, resin and silicone complex glue, or acrylic adhesive, the opaque glue is liquid at the room temperature and the solidification temperature of the opaque glue is lower than the glass transition temperature of the transparent molding material), by forming the opaque blocking element between the light sensing element and the light emitting element, the crosstalk between the light sensing element and the light emitting element can be reduced.

Those skilled in the art will readily observe that numerous modifications and alterations of the device and method can be made while retaining the teachings of the invention. Accordingly, the above disclosure should be construed as limited only by the metes and bounds of the appended claims.

What is claimed is:

1. A complex sensing device packaging structure, comprising:
    a light emitting element sealed in a first transparent molding material;
    a light sensing element sealed in a second transparent molding material;
    a substrate disposed with the light emitting element, the light sensing element, the first transparent molding material and the second transparent molding material; and
    an opaque blocking element disposed on the substrate and between the first transparent molding material and the second transparent molding material, wherein the opaque blocking element is formed by performing a solidifying process to an opaque glue being liquid at the room temperature;
    wherein a solidification temperature of the opaque blocking element is lower than a glass transition temperature of the first transparent molding material and the second transparent molding material.

2. The complex sensing device packaging structure of claim 1, wherein the opaque blocking element is made of epoxy resin, silicone glue, resin and silicone complex glue, or acrylic adhesive.

3. The complex sensing device packaging structure of claim 1, wherein a first side surface of the opaque blocking element is contacted with and the first transparent molding material, a second side surface of the opaque blocking element is contacted with the second transparent molding material, and a lower surface of the opaque blocking element is contacted with the substrate is contacted with.

4. The complex sensing device packaging structure of claim 1, wherein an upper surface of the opaque blocking element is a flat surface or a convex surface.

5. The complex sensing device packaging structure of claim 1, wherein the light emitting element is configured for a proximity sensor, and the light sensing element is configured for the proximity sensor or an ambient light sensor.

6. The complex sensing device packaging structure of claim 1, wherein the solidification process is a low temperature solidification process lower than 100 Celsius degrees, a room temperature solidification process, a high temperature solidification process higher than 100 Celsius degrees, or an ultraviolet solidification process.

7. A complex sensing device packaging method, comprising:
- disposing a light emitting element and a light sensing element on a substrate;
- sealing the light emitting element in a first transparent molding material, and sealing the light sensing element in a second transparent molding material;
- forming a molding space between the first transparent molding material and the second transparent molding material; and
- dropping a liquid opaque glue into the molding space to form a blocking element by performing a solidifying process to the liquid opaque glue;
- wherein a solidification temperature of the liquid opaque glue is lower than a glass transition temperature of the first transparent molding material and the second transparent molding material.

8. The complex sensing device packaging method of claim 7, wherein the opaque blocking element is made of epoxy resin, silicone glue, resin and silicone complex glue, or acrylic adhesive.

9. The complex sensing device packaging method of claim 7, wherein forming the molding space between the first transparent molding material and the second transparent molding material comprises:
- forming the first transparent molding material, the second transparent molding material and the molding space on the substrate by molding.

10. The complex sensing device packaging method of claim 7, wherein forming the molding space between the first transparent molding material and the second transparent molding material comprises:
- forming a transparent molding material on the substrate by molding; and
- carving the transparent molding material to form the first transparent molding material, the second transparent molding material and the molding space on the substrate.

11. The complex sensing device packaging method of claim 7, wherein the solidification process is a low temperature solidification process lower than 100 Celsius degrees, a room temperature solidification process, a high temperature solidification process higher than 100 Celsius degrees, or an ultraviolet solidification process.

* * * * *